United States Patent [19]
Matsuoka et al.

[11] Patent Number: 5,614,423
[45] Date of Patent: Mar. 25, 1997

[54] METHOD FOR FABRICATING A HETEROJUNCTION BIPOLAR TRANSISTOR

[75] Inventors: Yutaka Matsuoka, Isehara; Shoji Yamahata, Atsugi, both of Japan

[73] Assignee: Nippon Telegraph and Telephone Corporation, Tokyo, Japan

[21] Appl. No.: 552,778

[22] Filed: Nov. 3, 1995

[30] Foreign Application Priority Data

Nov. 7, 1994 [JP] Japan .................................. 6-271969

[51] Int. Cl.$^6$ ................................................. H01L 21/265
[52] U.S. Cl. .......................... 437/31; 437/126; 437/133; 437/93; 437/228
[58] Field of Search ............................ 437/31, 126, 133, 437/93, 228

[56] References Cited

U.S. PATENT DOCUMENTS

| | | | |
|---|---|---|---|
| 5,063,427 | 11/1991 | Chandrasekhar et al. | 257/458 |
| 5,206,524 | 4/1993 | Chen et al. | 257/29 |
| 5,345,097 | 9/1994 | Nakagawa | 437/133 |
| 5,389,554 | 2/1995 | Liu et al. | 437/60 |
| 5,468,659 | 11/1995 | Hafizi et al. | 437/133 |

FOREIGN PATENT DOCUMENTS

| | | |
|---|---|---|
| 5-48078 | 2/1993 | Japan . |
| 5-136159 | 6/1993 | Japan . |
| 5-243258 | 9/1993 | Japan . |

OTHER PUBLICATIONS

IEICE Trans. Electron, Sep. 1993, vol. E76–C, No. 9, pp. 1392–1401, "IC–Oriented Self–Aligned High–Performance AIGaAs/GaAs Ballistic Collection Transistors and Their Applications to High–Speed ICs", Yataka Murata et al.

IEEE, May 1995, pp. 643–647, "Novel Self–Aligned Sub–micron Emitter InP/InGaAs HBT's Using T–Shaped Emitter Electrode", Hiroshi Masuda et al.

IEEE, 1995, pp. 163–166, "Over–220–Ghz–$f_t$–and–$f_{max}$ InP/InGaAS Double–Heterojunction Bipolar Transistors with a New Hexagonal–Shaped Emitter", Shoji Yamahata et al.

*Primary Examiner*—Tuan H. Nguyen
*Attorney, Agent, or Firm*—Spencer & Frank

[57] ABSTRACT

A self-aligned heterojunction bipolar transistor is disclosed which includes a semiconductor substrate having the (100) plane as a main surface, and at least a collector region, a base region, and an emitter region having a bandgap greater than the base region. The emitter region has an under-cut mesa structure and its crystal orientation is defined in a direction other than that parallel to the [011] direction. In neither the [001] direction nor the [01$\bar{1}$] direction has the transistor any outwardly slanted structure that could cause leakage current between the emitter and base and, hence, the transistor has improved electric isolation between the emitter and base although it is self-aligned.

10 Claims, 4 Drawing Sheets

METHOD FOR FABRICATING A HETEROJUNCTION BIPOLAR TRANSISTOR

BACKGROUND OF THE INVENTION

1. Field of the Invention

The present invention relates to a heterojunction bipolar transistor (hereafter, referred to as an "HBT") and to a method for fabricating the same. More particularly, the present invention relates to an HBT which can be fabricated with ease, shows a low leakage current between its emitter and base, and has excellent high frequency characteristics, and to a method for fabricating such an HBT.

2. Description of Related Art

HBTs provide numerous advantages in providing high performance transistors. For example, they can retain high emitter injection efficiency even when impurities are doped in high concentrations in the base by the use of a semiconductor material for the emitter layer whose bandgap is greater than that of the base layer, they can take the best use of excellent electron transport inherent to compound semiconductors, and so on.

Compound semiconductor HBTs are fabricated generally by epitaxially growing desired semiconductor layers including an emitter layer, a base layer, and a collector layer on a semiconductor substrate whose (100) plane is taken as a main surface, etching some of the semiconductor layers thus obtained to form a mesa structure, and forming ohmic contacts on the emitter, base, and collector layers.

FIG. 1 shows an example of a conventional HBT. In FIG. 1, reference numeral 31 designates a semi-insulate InP (100) substrate, 32 is an $n^+$-InGaAs collector contact layer, 33 is an $n^-$-doped or undoped InGaAs collector layer, 34 is a $p^+$-InGaAs base layer, 35 is an $n^-$-InP emitter layer, 36 is an $n^+$-InGaAs emitter contact layer, 37 is an emitter electrode, and 38 is a base electrode. The HBT shown in FIG. 1 comprises the semi-insulate substrate 31, which has deposited thereon the collector contact layer 32, the collector layer 33, and the base layer 34. In its emitter region, the HBT has the emitter layer 35, the emitter contact layer 36, and the emitter electrode 37, with these layers being arranged such that an under-cut is formed underneath the peripheral portion of the emitter electrode 37 as a result of emitter mesa etching and isotropic wet etching. The HBT also includes the base electrode 38 deposited on the base layer 34 and the emitter electrode 37.

In the conventional HBT, as shown in FIG. 1, the crystal orientation of the emitter region in the (100) plane is oriented in a direction parallel to the [011] or [01$\underline{1}$] direction (herein, in the expression of plane or Miller indices, negative indices are indicated by underlining). This means that when a semiconductor substrate 31 having a (100) plane in a main surface is used, its orientation flat is selected so as to be in the (011) plane where cleave facets tend to appear, i.e., in the direction parallel to the [01$\underline{1}$] direction and it has been considered natural to set the direction of arranging the emitter so that it is parallel or vertical to the orientation flat thereof.

Next, problems will be described which may arise when the crystal orientation of the emitter is arranged in the (100) plane in the direction conventionally used, referring to a cross-sectional structure of the device.

In order to make the best use of the inherent potential of HBTs and reach extremely high performance levels, it is necessary to reduce the parasitic effects, that is, to lower ohmic resistances and parasitic capacitances, and various self alignment structures have been proposed. Japanese Patent Application Laying-open No. 136159/1993 and IEICE Trans. Electron. Vol. E76-C, No. 9 Sep., 1993, pp. 1392–1401 disclose self-aligned HBT structures with considerably low parasitic resistances and parasitic capacitances as well as with excellent uniformity and reproducibility and methods for fabricating such structures. According to these technologies, the emitter electrode is formed in advance and emitter mesa etching is performed with an etchant which etches the emitter layer selectively until the base layer is exposed using the emitter electrode as a mask, and at the same time an under-cut is formed underneath the peripheral portion of the emitter electrode utilizing the isotropic nature of wet etching. Thereafter, a base electrode material is deposited on the surface of the substrate in the region including the emitter mesa. The above-described structures and methods allow self-alignment of the emitter and base electrodes without a short because of the provision of an under-cut. Furthermore, with the structures and methods, it is easy to make the base electrode narrower, which is advantageous in reducing the contact area between the base and collector.

However, control of the crystal orientation of the emitter only in a direction parallel to the [01$\underline{1}$] or [011] direction raises a problem in relation to the anisotropy of the crystal upon wet etching. That is, as shown in FIG. 1, the emitter mesa structure formed by wet etching is in the form of a trapezoid with its lower edge being shorter, i.e., in the form of an under-cut mesa structure, in a cross-sectional view taken along the direction parallel to the [01$\underline{1}$] direction, i.e., as viewed in the (011) plane. On the contrary, as viewed in a cross-section along a direction parallel to the [011] direction, i.e., in the (0$\underline{1}$1) plane, the emitter mesa is in the form of a trapezoid with its upper edge being shorter, i.e., in the form of an outwardly slanted structure. The use of selective etching results in that the etching proceeds along a vertical direction so that after the base layer 34 is exposed, side etching along the [011] direction does not proceed substantially. Under these conditions, the method for fabricating a self-alignment structure by the deposition of a metal for the formation of the base electrode on the surface of the semiconductor substrate in the region including the emitter mesa gives a structure in which the base electrode 38 tends to contact the emitter layer 35 in a cross-section of an outwardly slant form. If the base electrode 38 contacts the emitter layer 35, leakage current which flows between the emitter and base increases to thereby reduce the current gain. In some cases, an E/B short occurs between the electrode 38 and the emitter electrode 37, so that the device cannot operate at all as a transistor.

A method has been proposed which is intended to form an under-cut reliably as viewed also in the cross-section along the (0$\underline{1}$1) plane, by using anisotropic dry etching and selective wet etching in combination in a desired manner. However, this approach has also a problem in that the process is not fully reproducible and controllable. Thus, in order to establish a reliable electric isolation between the emitter and base, the time of etching in a selective etching procedure needs to be prolonged to thereby increase the amount of the under-cut. In this occasion, the proportions of the base resistance and base/collector junction area to the emitter/base junction area increase, respectively, so that the high frequency operation of the transistor is damaged. This is worse as the transistor is smaller in scale because it is intended to operate at a high performance.

Japanese Patent Application Laying-open No. 48078/1993 discloses an AlGaAs/GaAs heterojunction bipolar transistor which has an HBT structure with a Be-doped base layer and an emitter region containing no orientation flat that is parallel to the [011] direction. At column 4, lines 43 to 47, there is a description to the effect that a difference in the shape of the emitter mesa gives rise to a difference in a stress applied to the interface between the surface protection insulator and an edge of the emitter mesa, so that the diffusion of Be upon application of current depends on the direction in which the emitter is formed. Further, at column 6, line 36, it also describes that the emitter is of a structure which has a long under-cut mesa edge and in which no outward slant shape appears, so that the diffusion of the impurities doped in the base layer upon application of current can be prevented in the vicinity of the outward slant edge and, hence, heterojunction bipolar transistors can be fabricated which have a very low variation in characteristics when they are operated at high current densities. FIG. 4 in the above-mentioned publication shows a structure in which the emitter is hexagonal and its longest edge is in a direction parallel to the [011] direction, with the extrinsic base layer and the base electrode surrounding the emitter mesa. This HBT structure is not self-aligned so that it cannot be applied to high performance, small-scale transistors.

Japanese Patent Application Laying-open No. 243258/1993 relates to a self-aligned InP/GaInAs based HBT in which the emitter is arranged such that one of the edges of the emitter is parallel to the [001] direction or perpendicular thereto and both ohmic electrodes are formed at the same time on the emitter cap and on the base. In this case, in order to make an under-cut utilizing the emitter cap as a mask, the same metal material is used for forming the emitter electrode and the base electrode.

SUMMARY OF THE INVENTION

An object of the present invention is to obviate the above-described defects of the prior art and provide a method for fabricating HBTs which ensures electric isolation between the emitter and the base even when selective etching of the emitter layer with a solution is carried out for a short time, and an HBT which can be fabricated with ease, shows low leakage current between the emitter and the base, and is excellent in its high frequency characteristics.

Another object of the present invention is to provide a method for fabricating an HBT which can make an under-cut utilizing a mask on the emitter cap.

Still another object of the present invention is to provide a self-aligned HBT in which the base layer is doped with a dopant having a small diffusion constant, which has different conductivity types between the emitter and base electrodes, and which ensures sufficient electrical isolation between the emitter and the base.

Therefore, according to a first aspect of the present invention, there is provided a method for fabricating a heterojunction bipolar transistor, comprising the steps of:

(a) forming a first semiconductor layer serving as a base layer on a collector layer formed on a compound semiconductor substrate;

(b) forming on the first semiconductor layer a second semiconductor layer serving as an emitter layer;

(c) forming on the second semiconductor layer a first conductive material layer which constitutes an emitter electrode, all edges of the emitter electrode being oriented in a direction other than the [011] direction;

(d) etching the second semiconductor layer by an etching process in the etching rate differs depending on an orientation of a crystal due to anisotropy of the crystal, utilizing the first conductive material layer as a mask, to expose the first semiconductor layer; and (e) depositing on the substrate a second conductive material to form a base electrode.

Here, the first conductive material constituting the emitter electrode may differ from the second conductive material constituting the base electrode.

The first conductive material constituting the emitter electrode and the second conductive material constituting the base electrode may comprise the same conductive material, the first and second conductive materials being doped with different amounts of the same dopant.

The transistor may have an InP/InGaAs heterojunction.

According to a second aspect of the present invention, there is provided a method for fabricating a heterojunction bipolar transistor, comprising the steps of:

(a) forming a first semiconductor layer serving as a base layer on a collector layer formed on a compound semiconductor substrate;

(b) forming on the first semiconductor layer a second semiconductor layer serving as an emitter layer;

(c) forming on the second semiconductor layer a first conductive material layer which constitutes an emitter electrode;

(d) forming an under-cut mesa in cross-sections parallel to the [011] and [01$\underline{1}$] directions, respectively, by an etching process in which the etching rate differs depending on an orientation of a crystal due to anisotropy of the crystal, utilizing the first conductive material layer as a mask, to expose the first semiconductor layer; and (e) depositing on the substrate a second conductive material to form a base electrode.

Here, the first conductive material constituting the emitter electrode may differ from the second conductive material constituting the base electrode.

The first conductive material constituting the emitter electrode and the second conductive material constituting the base electrode may comprise the same conductive material, the first and second conductive materials being doped with different amounts of the same dopant.

The transistor may have an InP/InGaAs heterojunction.

According to a third aspect of the present invention, there is provided a heterojunction bipolar transistor comprising:

(a) a semiconductor substrate having the (100) plane as a main surface;

(b) a collector region provided on the semiconductor substrate;

(c) a base region provided on the semiconductor substrate;

(d) an emitter region provided on the semiconductor substrate, the emitter region having a bandgap greater than that of the base region;

the emitter region having a crystal orientation defined in a direction other than that parallel to the [01$\underline{1}$] direction; and the base region being doped with an impurity element having a diffusion constant smaller than that of beryllium (Be).

Here, the impurity element may be carbon (C).

The first conductive material constituting the emitter electrode may differ from the second conductive material constituting the base electrode.

The first conductive material constituting the emitter electrode and the second conductive material constituting the base electrode may comprise the same conductive material, the first and second conductive materials being doped with different amounts of the same dopant.

The transistor may have an InP/InGaAs heterojunction.

According to a fourth aspect of the present invention, there is provided a self-aligned heterojunction bipolar transistor comprising:

(a) a semiconductor substrate having the (100) plane as a main surface;

(b) a collector layer provided on said semiconductor substrate;

(c) a base layer provided on the semiconductor substrate;

(d) an emitter layer provided on the semiconductor substrate, the emitter layer having a bandgap greater than that of the base layer;

(e) an emitter electrode provided on the emitter layer, all edges of the emitter layer having a crystal orientation defined in a direction other than that parallel to the [01$\bar{1}$] direction; and (f) a base electrode provided on an exposed part of the base layer that is not covered with the emitter layer;

the emitter layer having an under-cut mesa structure in cross-sections parallel to the [011] and [01$\bar{1}$] directions, respectively.

Here, the base region may be doped with an impurity element having a diffusion constant smaller than that of beryllium (Be).

The impurity element may be carbon (C).

The emitter and base electrodes may be composed of different conductive materials.

The emitter and base electrodes may comprise the same conductive material, doped with different amounts of the same dopant.

The transistor may have an InP/InGaAs heterojunction.

The above and other objects, effects, features and advantages of the present invention will become more apparent from the following description of the embodiment thereof taken in conjunction with the accompanying drawings.

DESCRIPTION OF PREFERRED EMBODIMENTS

Figure 1:
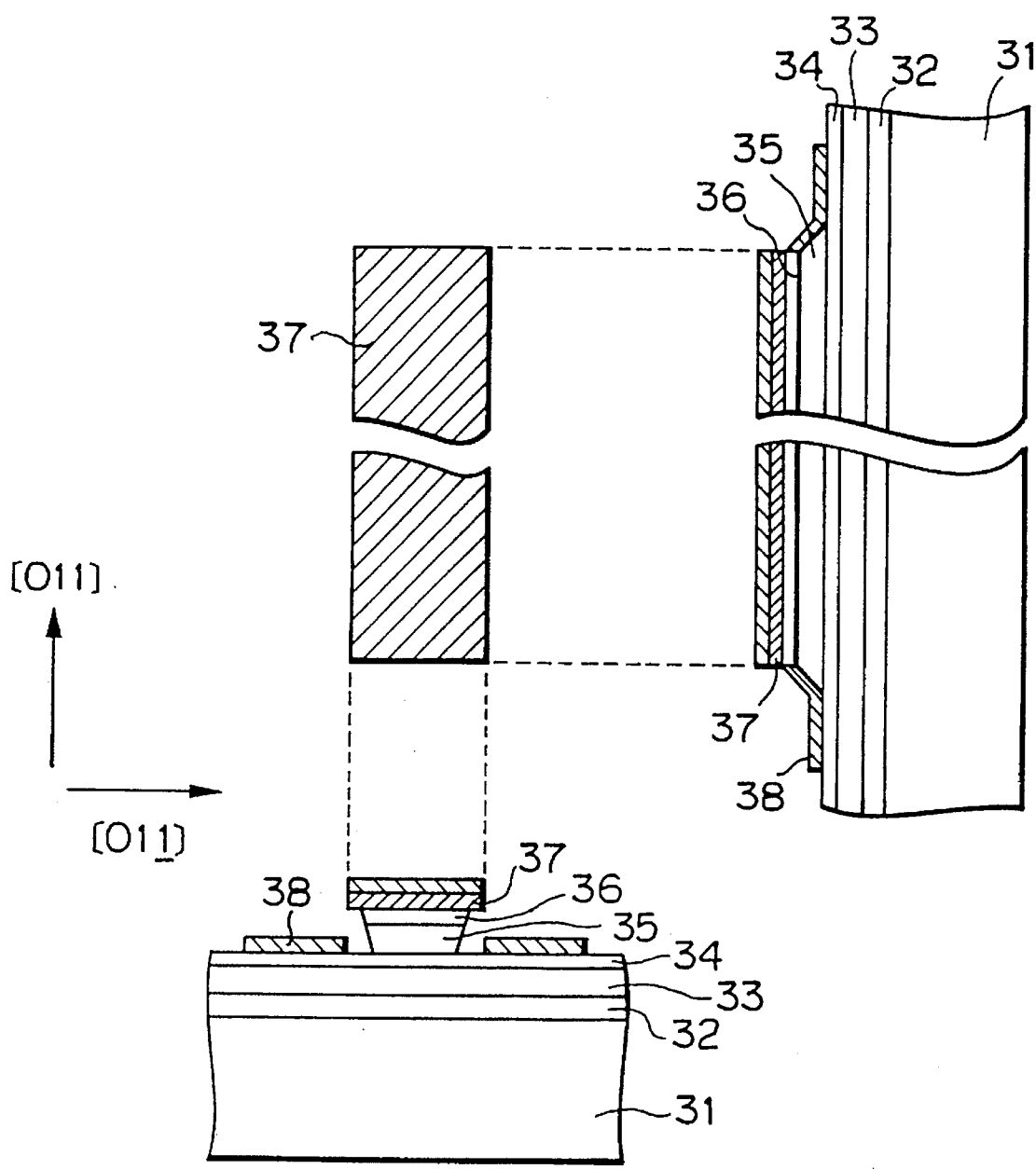
FIG. 1 is a schematic view showing part of the structure of a conventional HBT including its emitter and base in cross-section and in a plan view.

The feature of the HBT of the present invention is that the crystal orientation defining the emitter is restricted to a specified one. Basically, the HBT of the present invention has a structure similar to that of the conventional HBT shown in FIG. 1 and can be fabricated in a manner similar to the method in which the conventional HBT is fabricated. However, in the present invention, the crystal orientation defining the emitter in the plane (100) is restricted to a direction other than the [01$\bar{1}$] direction so that no over-cut mesa can appear.

Since the direction in which an over-cut mesa appears upon selective etching of the emitter layer is prohibited in the HBT of the present invention, the emitter mesa is always smaller in size than the mask used upon the etching of the emitter mesa with an etching solution. Hence, when viewed in a plan view, the region which defines the emitter/base junction always is inside the region which the mask material used in the etching covers. Accordingly, if the deep etching of the emitter layer proceeds until a part of the surface of the base is exposed, there is formed without fail an under-cut mesa with respect to the mask material and establishes electrical isolation between the emitter and the base.

Therefore, when emitter mesa etching is performed using the emitter electrode as a mask material and then a base electrode material is deposited over the surface of the semiconductor substrate including the region where the emitter mesa is present, the emitter and the base are isolated electrically from one another with ease and without fail, thus attaining a high yield. In this structure, leakage current which flows between the base and emitter can be decreased without excessive etching for forming such an under-cut.

Further, with the structure of the present invention, there is no need to intentionally increase the size or amount of the under-cut, so that the emitter mesa need not be made smaller than is necessary. This results in reduced proportions of the base resistance and the base/collector junction capacitance to the emitter/base junction area. Therefore, the present invention can provide HBTs with excellent high-frequency characteristics.

Hereinafter, the present invention will be described in greater detail by embodiments with reference to the attached drawings. However, the present invention should not be construed as being limited thereto.

Embodiment 1

Figure 2:
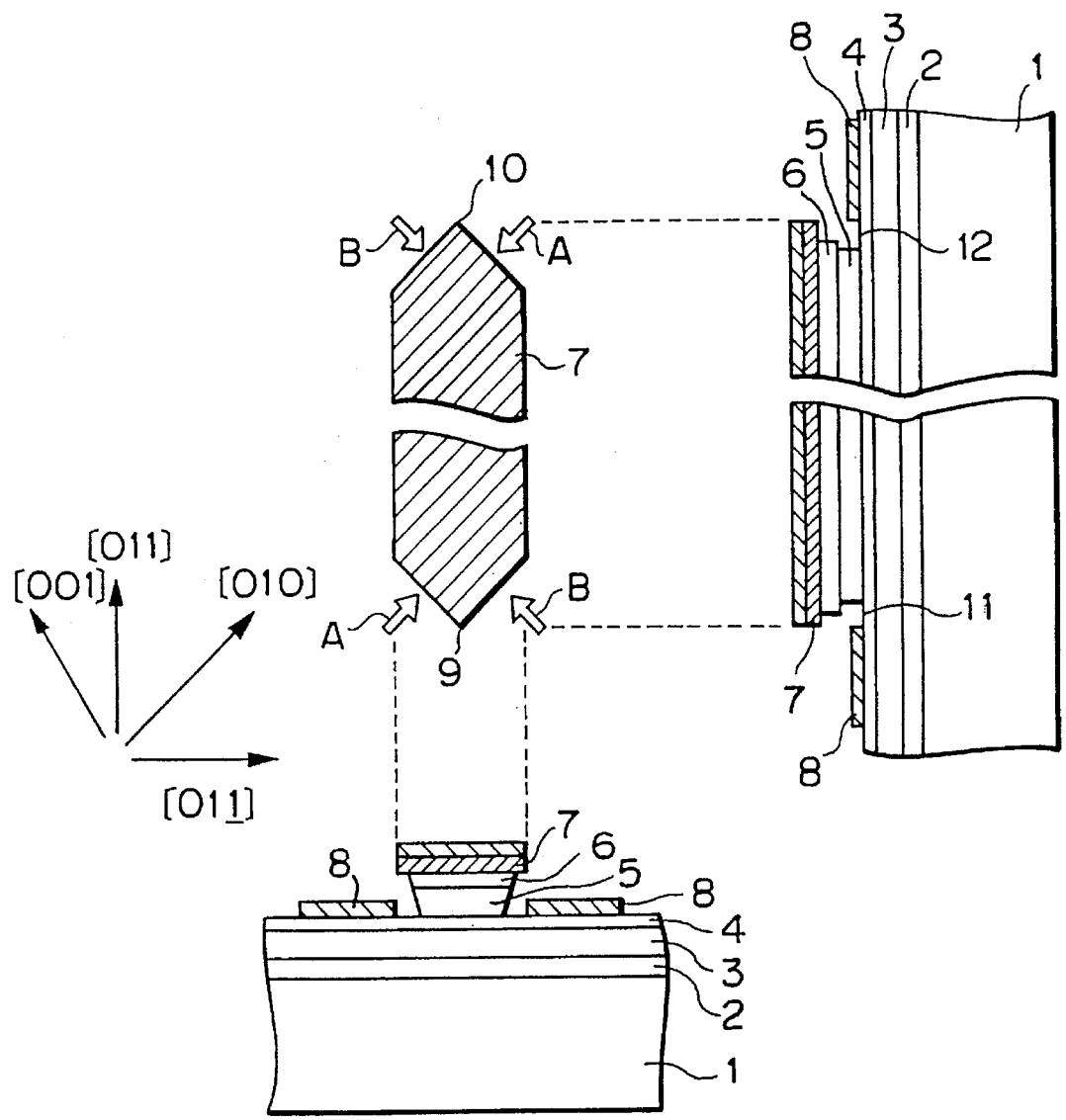
FIG. 2 is a schematic view showing part of the structure of an HBT according to a first embodiment of the present invention including its emitter and base in cross-section and in a plan view.

FIG. 2 shows an example of the emitter structure of an HBT according to a first embodiment of the present invention.

In FIG. 2, reference numeral 1 designates a semi-insulate InP (100) substrate, 2 is an $n^+$-InGaAs collector contact layer, 3 is an InGaAs collector layer containing an $n^-$-type impurity or dopant or an undoped InGaAs, 4 is a $p^+$-InGaAs base layer, 5 is an $n^-$-InP emitter layer, 6 is an $n^+$-InGaAs emitter contact layer, 7 is an emitter electrode, 8 is a base electrode, 9 and 10 are intersecting points between edges along the [010] and [001] directions on the periphery of an emitter electrode region, and 11 and 12 are ends of the emitter/base junction underneath the line connecting the intersecting points 9 and 10.

Figure 3A:
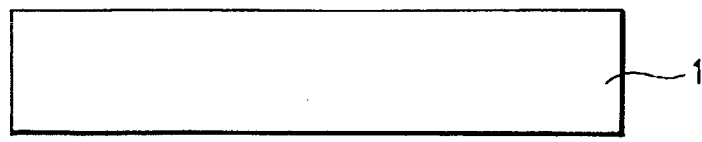
FIGS. 3A, 3B, 3C, 3D, and 3E are cross-sectional views showing semiconductor device structures during various stages of a fabrication process for fabricating an HBT according to the first embodiment of the present invention.
Figure 3B:
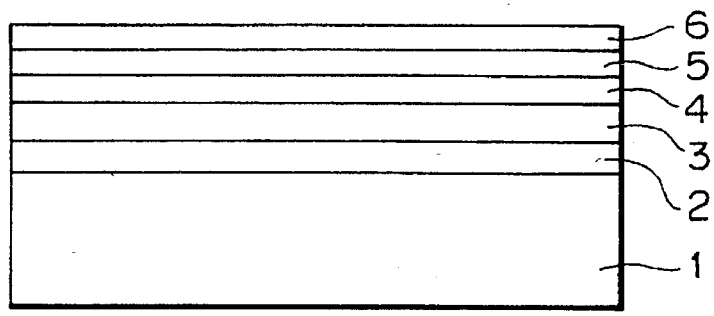

The layer structure of the crystal is formed by molecular beam epitaxy (MBE) or metalorganic chemical vapor deposition (MOCVD). For example, an InP substrate 1 is provided (FIG. 3A). On the substrate 1, there are epitaxially grown sequentially a subcollector layer or collector contact layer 2 composed of InGaAs containing a high concentration of an n-type impurity or dopant for forming an ohmic contact on a collector 3, the collector layer 3 composed of InGaAs containing an n-type impurity or undoped InGaAs, a base layer 4 composed of InGaAs containing a high concentration of a p-type impurity such as C, Be, Zn, etc., an emitter layer 5 composed of InP containing n-type impurity such as Si, Se, etc., and an emitter contact layer 6 composed of InGaAs containing a high concentration of an n$^+$-type impurity such as Si, Se, etc. for establishing an ohmic contact to the emitter (FIG. 3B).

Figure 3C:
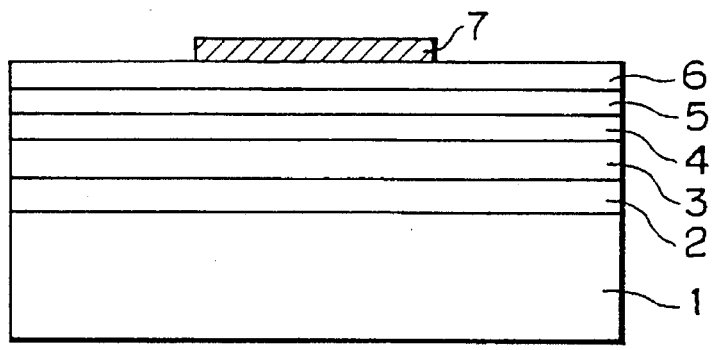
Figure 3D:
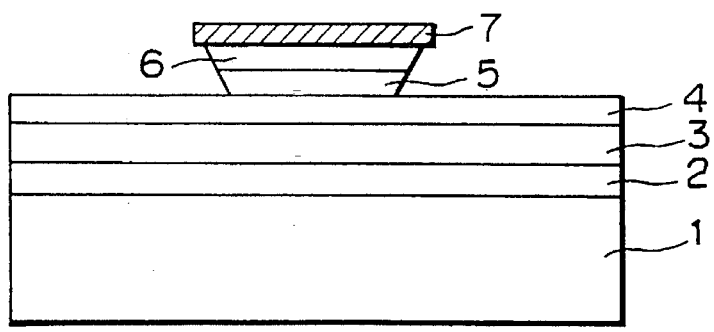

Next, an emitter electrode 7 composed of a laminate of Ti/Pt/Au or a layer of WSi is formed as by liftoff (FIG. 3C). In this occasion, the region where the emitter electrode is to be provided is defined such that the crystal orientation in the plane (100) in which the emitter is defined is parallel to any of the [011̄], [010] and [011] directions. Then, the InGaAs emitter contact layer 6 and a part of the InP emitter layer 5 are etched using the emitter electrode 7 as an etching mask by reactive ion etching (RIE) with chlorine gas or chlorine-containing gas utilizing electron cyclotron resonance. In this dry etching, etching proceeds vertically but no side etching occurs. Subsequent to the dry etching, wet etching is performed, for example, with a mixture of sulfuric acid, hydrogen peroxide, and water to effect side etching of the InGaAs emitter contact layer 6 below the emitter electrode 7. In this step, there occurs no etching of the InP emitter layer 5. Thereafter, the InP emitter layer 5 is etched with a mixed solution composed of hydrochloric acid and water to expose the InGaAs base layer 4. In this wet etching, the InGaAs emitter contact layer 6 and the InGaAs base layer 4 are not etched. The wet etching does not last for a long time but it is only necessary for it to continue until the base layer 4 is exposed. Thus, the structure shown in FIG. 3D is obtained. Alternatively, the InP emitter layer 5 may remain in a small thickness as far as it can be depleted completely. Accordingly, the time of the selective etching of the emitter layer 6 with a mixture of hydrochloric acid and water does not have to last for a longer time than is necessary. Finally, an electrode 8 is formed in the region including the emitter mesa (FIG. 3E).

Figure 3E:
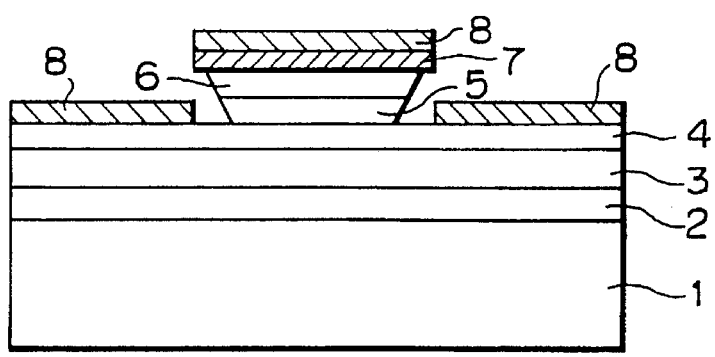

In the above-described method for fabricating an HBT, the base electrode material is also deposited on the emitter electrode 7 as shown in FIG. 3E. However, in cross-section along the (011) plane, an under-cut mesa appears, so that the electric isolation between the emitter and base is perfect. On the other hand, when viewed in the (01̄1) plane, the cross section or profile is in the form of an outward slant, and on the face of it, there could be the danger of an E/B short or an increase in leakage current between the emitter and base. However, in the present embodiment, the emitter electrode 7 has no edge that is parallel to the [011] direction but instead its edges are defined in directions parallel to the [010] and [001] directions, respectively, as indicated by arrows A and B, respectively. Since etching along the [001] or [010] direction, like the etching along the [100] direction, proceeds quickly, the points 11 and 12 where the emitter/base junction is exposed are moved or retreated toward the inside of the emitter electrode 7 because etching from both sides proceeds even at the intersecting points 9 and 10 between the edges parallel to the [010] and [001] directions on the periphery of the emitter electrode region. Therefore, perfect electrical isolation between the emitter and base can be achieved even in the cross-section as viewed in the (011) plane.

Embodiment 2

Figure 4:
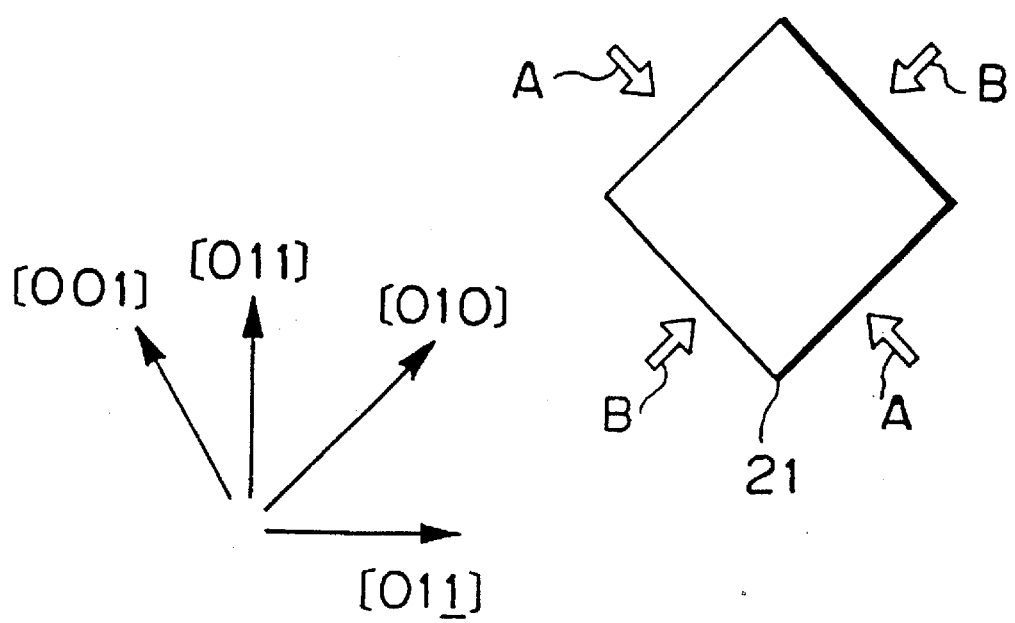
FIG. 4 is a schematic plan view showing the structure of the emitter of an HBT according to a second embodiment of the present invention.

FIG. 4 shows another example of the structure in plan view of the emitter of an HBT according to a second embodiment of the present invention. The layer structure of the crystal and fabrication process for fabricating the HBT are substantially the same as in Embodiment 1 above. However, in the present embodiment, the crystal orientation of the emitter electrode is defined in the (100) plane by two edges parallel to the [010] direction as indicated by respective arrows A and two edges parallel to the [001] direction as indicated by respective arrows B only. In this case, the emitter mesa is surrounded by the (001), (010), (001̄), and (01̄0) planes where etching proceeds vertically and at the same rate, so that an under-cut can be formed with ease along the entire periphery of the emitter mesa with a good controllability.

In the above embodiments, the explanation has been presented based on the most basic structure in InP/InGaAs systems regarding the layer structure of the crystal. However, the present invention should not be construed as being limited thereto. The present invention is also applicable to double heterojunction bipolar transistors and HBTs made of other material systems such as AlGaAs/GaAs and the like. As for the fabrication process, the description has been presented based on the process in which the emitter electrode is formed first and wet etching is performed utilizing the emitter electrode as a mask. However, the present invention should not be construed as being limited to this type of fabrication process but can also be applied to various fabrication processes as far as they use emitter mesa etching which involves wet etching or etching with an etching solution in a part or all of the process.

In the present invention, emitter and base electrodes are formed separately so that both electrodes may be made of different electrode materials, i.e., various electrode materials with different compositions can be used in combination. More particularly, p- and n-type electrode materials can be used for the base and emitter electrodes, respectively, and, hence, electrodes having excellent ohmic characteristics can be obtained. Also, the base and emitter electrodes can be made of the same conductive material doped with a dopant at different concentrations. This enables simplification of the fabrication process.

The present invention has been described in detail with respect to embodiments thereof, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A method for fabricating a heterojunction bipolar transistor, comprising the steps of:

(a) forming a first semiconductor layer serving as a base layer on a collector layer which is supported by a compound semiconductor substrate;

(b) forming on said first semiconductor layer a second semiconductor layer comprising InP serving as an emitter layer;

(c) forming on said second semiconductor layer a first conductive material layer which constitutes an emitter electrode, all edges of said emitter electrode being oriented in a direction other than the [011̄1] direction;

(d) etching said second semiconductor layer by an etching process in which the etching rate differs depending on an orientation of a crystal due to anisotropy of said crystal, utilizing said first conductive material layer as a mask, to expose said first semiconductor layer; and (e) depositing on said first semiconductor layer a second conductive material layer to form a base electrode.

2. The method for fabricating a heterojunction bipolar transistor as claimed in claim 1, wherein said first conductive material constituting said emitter electrode differs from said second conductive material constituting said base electrode.

3. The method for fabricating a heterojunction bipolar transistor as claimed in claim 1, wherein said first conductive material constituting said emitter electrode and said second conductive material constituting said base electrode comprise the same conductive material, said first and second conductive materials being doped with different amounts of the same dopant.

4. The method for fabricating a heterojunction bipolar transistor as claimed in claim 1, wherein said transistor has an InP/InGaAs heterojunction.

5. The method for fabricating a heterojunction bipolar transistor as claimed in claim 1, wherein at least a portion of the etching process of step (d) comprises wet etching.

6. A method for fabricating a heterojunction bipolar transistor, comprising the steps of:

(a) forming a first semiconductor layer serving as a base layer on a collector layer which is supported by a compound semiconductor substrate;

(b) forming on said first semiconductor layer a second semiconductor layer comprising InP serving as an emitter layer;

(c) forming on said second semiconductor layer a first conductive material layer which constitutes an emitter electrode;

(d) forming an under-cut mesa in cross-sections parallel to the [011] and [01$\bar{1}$] directions, respectively, by an etching process in which the etching rate differs depending on an orientation of a crystal due to anisotropy of said crystal, utilizing said first conductive material layer as a mask, to expose said first semiconductor layer; and (e) depositing on said first semiconductor layer a second conductive material layer to form a base electrode.

7. The method for fabricating a heterojunction bipolar transistor as claimed in claim 6, wherein said first conductive material constituting said emitter electrode differs from said second conductive material constituting said base electrode.

8. The method for fabricating a heterojunction bipolar transistor as claimed in claim 6, wherein said first conductive material constituting said emitter electrode and said second conductive material constituting said base electrode comprise the same conductive material, said first and second conductive materials being doped with different amounts of the same dopant.

9. The method for fabricating a heterojunction bipolar transistor as claimed in claim 6, wherein said transistor has an InP/InGaAs heterojunction.

10. The method for fabricating a heterojunction bipolar transistor as claimed in claim 6, wherein at least a portion of the etching process of step (d) comprises wet etching.

* * * * *